(12) United States Patent
Hehmann

(10) Patent No.: US 6,379,778 B1
(45) Date of Patent: Apr. 30, 2002

(54) METHOD OF CHECKING THE ACCURACY OF THE RESULT OF A MULTISTEP ETCHING PROCESS

(75) Inventor: Jörg Hehmann, Nürnberg (DE)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/542,678

(22) Filed: Apr. 4, 2000

Related U.S. Application Data

(62) Division of application No. 08/991,673, filed on Dec. 16, 1997, now Pat. No. 6,077,449.

(30) Foreign Application Priority Data

Dec. 19, 1996 (DE) .......................................... 196 52 974

(51) Int. Cl.[7] .................................................. B32B 3/00
(52) U.S. Cl. ...................................... 428/156; 428/167
(58) Field of Search ................................ 428/159, 141, 428/167, 212

(56) References Cited

U.S. PATENT DOCUMENTS

| | | | |
|---|---|---|---|
| 1,881,803 A | * 10/1932 | Mattison | ..................... 428/167 |
| 4,529,314 A | 7/1985 | Ports | |
| 4,814,213 A | * 3/1989 | Thorn | .......................... 428/34 |
| 5,470,782 A | * 11/1995 | Schwalke et al. | ............. 437/70 |

FOREIGN PATENT DOCUMENTS

| | | |
|---|---|---|
| DE | 243537 | 6/1910 |
| DE | 1521690 | 9/1969 |
| DE | 2226149 | 5/1973 |
| DE | 0152365 | 11/1981 |
| EP | 0656651 | 6/1995 |

OTHER PUBLICATIONS

"MEMS: Small machines for the microelectronics age" by Koester, et al. MCNC MEMS Technology Applications Center, Jan. 1996, pp. 93–94. XP–000749841.

Geiser, Ralph, "Reticle Production", In: The Instrument Maker, Jul./Aug. 1948 pp. 4, 6–8, 12.

* cited by examiner

Primary Examiner—Donald J. Loney
(74) Attorney, Agent, or Firm—Ware, Fressola, Van Der Sluys & Adolphson LLP

(57) ABSTRACT

A method is disclosed for checking the accuracy of the result of a multistep etching process for forming depressions in a substrate. The check is made possible in a simple manner by providing line patterns on the etch masks. The line patterns on the etch masks for different etching steps are different and form a vernier system.

6 Claims, 2 Drawing Sheets

Structures in Mask Nbr 1 | Structures in Mask Nbr 2

METHOD OF CHECKING THE ACCURACY OF THE RESULT OF A MULTISTEP ETCHING PROCESS

This application is a divisional application of U.S. application Ser. No. 08/991,673 filed Dec. 16, 1997 now U.S. Pat. No. 6,077,449. Said application was allowed on Mar. 8, 2000 and claimed priority to German Application No. 196 52 974.3 filed Dec. 19, 1996.

TECHNICAL FIELD

This invention relates to a method of checking the accuracy of the result of a multistep etching process for forming depressions in a substrate.

BACKGROUND OF THE INVENTION

Components which have high-precision micropatterns are produced by etching. This involves providing them with etch masks using a photolithographic technique. If the micropatterns are complex, i.e., if they have different depths, and are additionally interleaved, two or more etching operations have to be performed.

Since the results of the different etching operations must be precisely positioned relative to each other, it is necessary to accurately align the different etch masks with one another, for which suitable apparatus is available. It is also necessary to be able to check the result of the multistep etching process for accuracy after completion of the micropattern.

SUMMARY OF THE INVENTION

The technical problem to be solved by the invention is to provide a means whereby it is possible to check in a simple manner whether the high-precision micropattern has the required accuracy after the multistep etching process.

According to the invention, a line pattern is provided on the etch masks, and the line patterns on the etch masks for different etching steps differ in such a way as to form a vernier system.

In applying this solution, a line pattern from which any deviation and its magnitude can be read directly is etched on the etched substrate.

BRIEF DESCRIPTION OF THE DRAWINGS

The invention will now be explained with reference to an embodiment shown in the accompanying drawings for a two-step etching process. In the drawings.

BEST MODE FOR CARRYING OUT THE INVENTION

Figure 1:
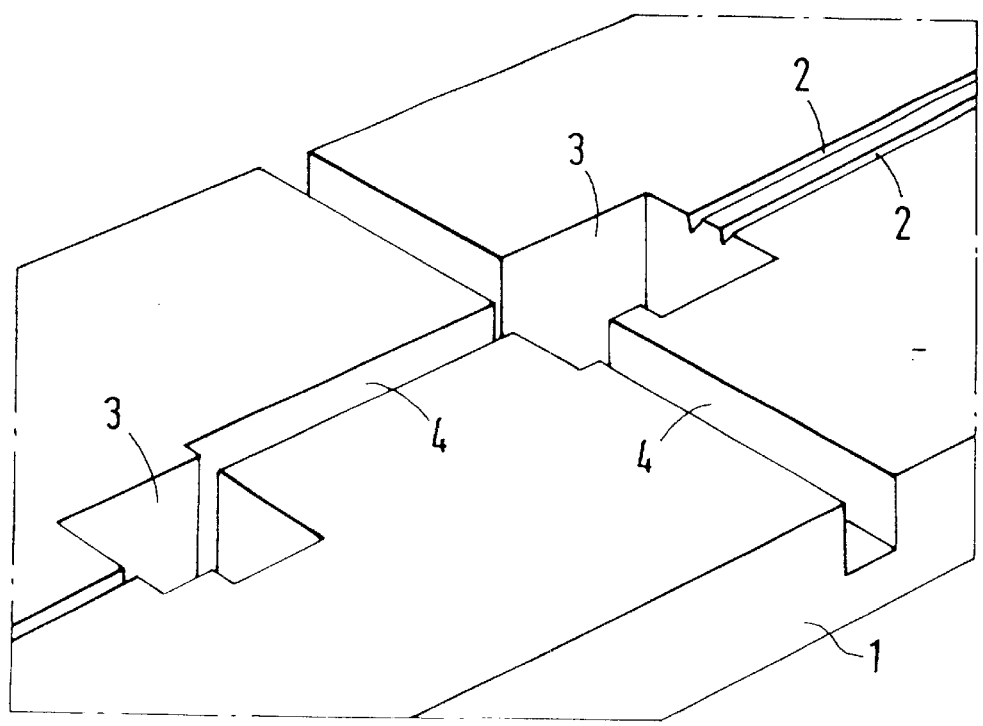
FIG. 1 shows a part of a substrate formed by a two-step etching process.

FIG. 1 shows a part of a substrate 1 in which depressions of different shapes and different depths were formed by etching. Relatively shallow grooves 2, boxlike depressions 3, and moats 4 are shown. Such substrates are used, for example, as microoptic benches in the manufacture of optoelectronic components. In such an application, the substrate is of silicon. However, the invention can also be used in the fabrication of other objects by multistep etching in order to check the quality imparted to the objects in the etching process. As is well known, a multitude of precision components are fabricated by contour etching (chemical machining).

Figure 2:
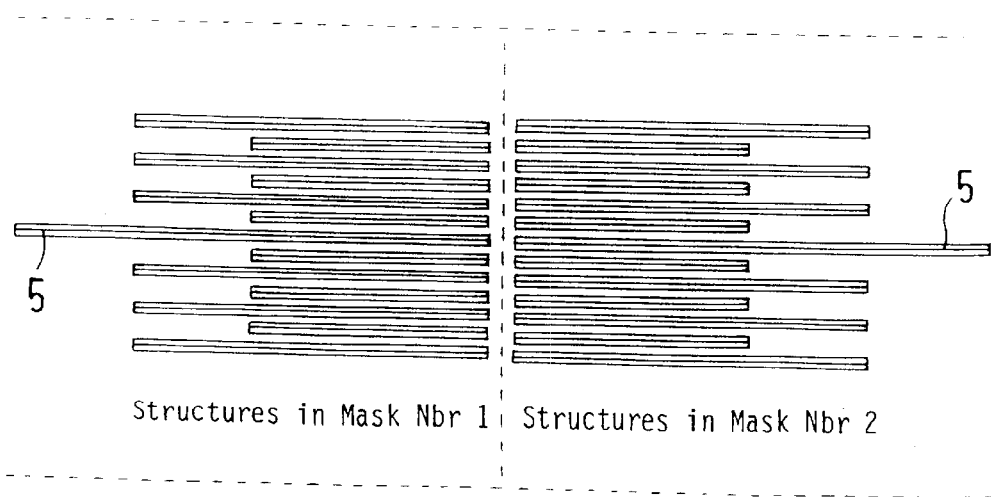
FIG. 2 shows the line patterns used on the two etch masks.

FIG. 2 shows the line patterns of two etch masks as are used in a two-step etching process. The left-hand line pattern is intended for the mask for the first etching operation; the center-to-center distance between the lines is a. The right-hand line pattern is intended for the mask for the second etching operation; the center-to-center distance between the lines is a+x, e.g., a+0.5 $\mu$m.

As can be seen from FIG. 2, the long lines 5 of the two line patterns are in alignment. If that were also true for the etched line pattern on the substrate, there would be no deviation between the two etching operations. If, however, two medium-long or short etched line patterns are in alignment on the substrate, the results of the two etching operations differ by 0.5 $\mu$m or a multiple thereof.

In the embodiment shown, the lines of the line pattern are separated by a distance of 40 $\mu$m (1st mask) or 40.5 $\mu$m (2nd mask). The line width is 20 $\mu$m, and the line lengths are 50.75 and 100 $\mu$m.

Figure 3:
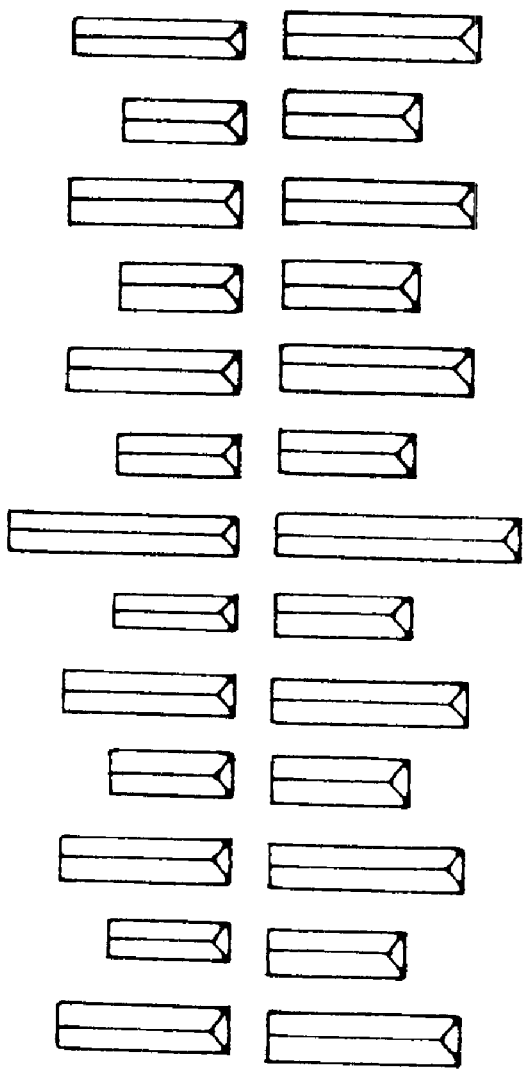
FIG. 3 shows the etched line patterns produced on the substrate using the etch masks.

FIG. 3 shows the etched line patterns on the substrate.

What is claimed is:

1. A substrate comprising:

depressions made according to a method which uses a multistep etching process and which uses at least two etching masks, the depressions having an overall accuracy depending upon relative accuracies of different steps of the multistep etching process; and at least two sets of opposing line patterns produced in the substrate using the at least two etching masks during different steps of said multistep etching process, wherein the line patterns form a vernier system, wherein each of the line patterns produced in the substrate includes one longest line, and further includes multiple shorter lines having a substantially uniform shorter length, and wherein alignment or misalignment of the opposing line patterns etched in the substrate displays how accurately the steps of the multistep etching process were implemented relative to each other, and therefore displays the overall accuracy of the depressions.

2. The substrate of claim 1, wherein alignment of the longest lines is indicative of no significant deviation between the different etching steps, and no significant inaccuracy of the depressions.

3. The substrate of claim 1, wherein at least two lines of two respective sets of the opposing line patterns are more closely aligned than any other lines of the two respective sets of opposing line patterns, and wherein the at least two lines are at least partly indicative of the overall accuracy of the depressions.

4. The substrate of claim 3, wherein each of the line patterns further includes multiple shortest lines having a substantially uniform shortest length.

5. The substrate of claim 1, wherein each of the opposing line patterns has a substantially equal number of lines, wherein each of the opposing line patterns has a uniform center-to-center distance between any two adjacent lines, and wherein the uniform center-to-center distance is different for at least two of the opposing line patterns.

6. A substrate comprising:
depressions made according to a method which uses a multistep etching process; and
at least two sets of opposing line patterns produced in the substrate using different etching steps of the multistep etching process,
wherein the line patterns form a vernier system,
wherein each of the line patterns produced in the substrate includes one longest line, and multiple shorter lines having a 'substantially uniform shorter length, and
wherein alignment or misalignment of the opposing line patterns etched in the substrate displays how accurate the depressions are, and how accurately the multistep etching process was implemented.

* * * * *

UNITED STATES PATENT AND TRADEMARK OFFICE
CERTIFICATE OF CORRECTION

PATENT NO.   : 6,379,778 B1  Page 1 of 1
DATED        : April 30, 2002
INVENTOR(S)  : Jorg Hehmann It is certified that error appears in the above-identified patent and that said Letters Patent is hereby corrected as shown below:

Column 2,
Line 62, which is line 2 of claim 4, "firther" should be -- further --.

Signed and Sealed this

Fourteenth Day of January, 2003

JAMES E. ROGAN
*Director of the United States Patent and Trademark Office*